United States Patent
Son et al.

(10) Patent No.: US 7,537,980 B2
(45) Date of Patent: May 26, 2009

(54) METHOD OF MANUFACTURING A STACKED SEMICONDUCTOR DEVICE

(75) Inventors: Yong-Hoon Son, Yongin-si (KR);
Yu-Gyun Shin, Seongnam-si (KR);
Jong-Wook Lee, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 134 days.

(21) Appl. No.: 11/510,622

(22) Filed: Aug. 28, 2006

(65) Prior Publication Data

US 2007/0048913 A1    Mar. 1, 2007

(30) Foreign Application Priority Data

Aug. 30, 2005    (KR) ............... 10-2005-0079773

(51) Int. Cl.
*H01L 21/00* (2006.01)
*H01L 21/8238* (2006.01)
*H01L 21/336* (2006.01)
*H01L 29/94* (2006.01)
*C30B 33/06* (2006.01)

(52) U.S. Cl. .............. 438/151; 438/44; 438/213; 438/222; 438/269; 438/607; 257/67; 257/348; 257/353; 257/E21.09; 257/E21.085; 117/1

(58) Field of Classification Search .......... 438/213, 438/222, 44, 269, 607; 257/67, 348, 353; 117/1

See application file for complete search history.

(56) References Cited

U.S. PATENT DOCUMENTS 6,538,330 B1    3/2003    Forbes

2001/0040292 A1    11/2001    Hahn et al.
2004/0157455 A1*    8/2004    Johansson et al. ........... 438/691

(Continued)

FOREIGN PATENT DOCUMENTS

KR    1020010073705 A    8/2001

(Continued)

OTHER PUBLICATIONS

Wolf, "Silicon Processing for hte VLSI Era, vol. 2: Process Integration," 1990, Lattice Press, pp. 61-63.*

(Continued)

*Primary Examiner*—Alexander G Ghyka
*Assistant Examiner*—Leonard Chang
(74) *Attorney, Agent, or Firm*—Harness, Dickey & Pierce

(57) ABSTRACT

In a method of manufacturing a stacked semiconductor device, a seed layer including impurity regions may be prepared. A first insulation interlayer pattern having a first opening may be formed on the seed layer. A first SEG process may be carried out to form a first plug partially filling the first opening. A second SEG process may be performed to form a second plug filling the first opening. A third SEG process may be carried out to form a first channel layer on the first insulation interlayer pattern. A second insulation interlayer may be formed on the first channel layer. The second insulation interlayer, the first channel layer and the second plug arranged on the first plug may be removed to expose the first plug. The first plug may be removed to form a serial opening. The serial opening may be filled with a metal wiring.

22 Claims, 14 Drawing Sheets

U.S. PATENT DOCUMENTS

2005/0179061 A1 * 8/2005 Jang et al. .................. 257/208

FOREIGN PATENT DOCUMENTS

| KR | 1020020081742 A | | 10/2002 |
|----|-----------------|---|---------|
| KR | 1020040025967 A | | 3/2004 |
| KR | 1020040025967 A | * | 3/2004 |

OTHER PUBLICATIONS

Aberg et al., "Fabrication of Strained Si/Strained SiGe/Strained Si Heterostructures on Insulator by a Bond and Etch-Back Technique," Oct. 2004, 2004 IEEE International SOI Conference, pp. 35-36.*

Raghavan, "Wet Etching and Cleaning: Surface Considerations and Process Issues," 1999, Arizona Board of Tegents for the University of Arizona, pp. 12.*

U.S. Appl. No. 11/823,765, filed Jun. 2007, Kim et al.*

U.S. Appl. No. 11/474,384, filed Jun. 2006, Kang et al.*

* cited by examiner

METHOD OF MANUFACTURING A STACKED SEMICONDUCTOR DEVICE

PRIORITY STATEMENT

This application claims priority the benefit of priority under 35 USC § 119 to Korean Patent Application No. 2005-79773, filed on Aug. 30, 2005, the entire contents of which are herein incorporated by reference.

BACKGROUND OF THE INVENTION

1. Field of the Invention

Example embodiments of the present invention relate to a method of manufacturing a semiconductor device. More particularly, example embodiments of the present invention relate to a method of manufacturing a stacked semiconductor.

2. Description of the Related Art

Recently, the size of semiconductor structures, for example, MOS transistors, and an interval between semiconductor structures has been reduced as design rules of semiconductor devices have been reduced. However, when the size of the semiconductor structures and the interval between the semiconductor structures are continuously decreased on substantially the same plane, resistances of the semiconductor structures may be increased and thus, the semiconductor devices including the semiconductor structures may have relatively poor electrical characteristics.

Conventionally, to solve the above-mentioned problems, a stacked semiconductor device including vertically stacked semiconductor structures has been developed. The stacked semiconductor device may be employed in a static random access memory (SRAM), a system-on-chip (SOC), etc.

In a conventional stacked semiconductor device, because a multi-layered semiconductor structure is vertically stacked, each of channel layers including single crystalline silicon, which may be used for a channel region, may be formed on multi-layered insulation interlayers. The channel layer may be formed by a selective epitaxial growth (SEG) process using a portion of a semiconductor substrate, which may be exposed through an opening of the insulation interlayer, as a seed. Thus, while the channel layer is formed, the opening may be sufficiently filled with a plug including single crystalline silicon.

Further, in a conventional stacked semiconductor device, because the vertically stacked semiconductor structures may be electrically connected to one another, the vertically stacked insulation interlayers may be patterned to form a serial opening exposing a surface of the semiconductor substrate. The serial opening may be filled with a metal wiring, which electrically connects between the semiconductor structures. The serial opening may expose a side face of the channel layer on the insulation interlayer as well as the surface of the semiconductor substrate. Impurity regions, for example, source/drain regions may be formed in the semiconductor substrate and may be electrically connected to the metal wiring.

However, as shown in a conventional device shown of FIG. 1, when the serial opening only exposes the plug on the semiconductor substrate, but not the surface of the semiconductor substrate, and is then filled with the metal wiring, the metal wiring may have a relatively high electrical resistance. The relatively high electrical resistance may be caused by the electrical connection between the metal wiring and the plug. That is, the metal wiring electrically connected to the plug may have a resistance higher than the resistance of a metal wiring electrically connected to the impurity regions in the semiconductor substrate.

On the contrary, as shown in a conventional device of FIG. 2, when a serial opening exposes the surface of the semiconductor substrate and is then filled with the metal wiring, a leakage current through the semiconductor substrate may be generated in the conventional device.

In the conventional device, an etching endpoint for forming the serial opening may be controlled in accordance with a lapse of time. Thus, in a conventional method of manufacturing a stacked semiconductor device, it may be very difficult to form the serial opening exposing the surface of the semiconductor substrate. As a result, the conventional stacked semiconductor device formed using the conventional method may have poor electrical reliability.

SUMMARY OF THE INVENTION

Example embodiments of the present invention provide a method of manufacturing a stacked semiconductor device that may be capable of readily forming a serial opening exposing a surface of impurity regions, which may be electrically connected to a metal wiring.

According to an example embodiment of the present invention, a seed layer including impurity regions may be prepared. A first insulation interlayer pattern having one or more first openings that at least partially exposes a surface of the seed layer may be formed on the seed layer. A first SEG process may be carried out on the exposed surface of the seed layer to form one or more first plugs, which may include single crystalline silicon germanium and partially fills the one or more first openings. A second SEG process may be performed on the one or more first plugs to form one or more second plugs, which may include single crystalline silicon and fill a remainder of the one or more first openings. A third SEG process may be carried out on the first insulation interlayer pattern to form a first channel layer, which may include single crystalline silicon on the first insulation interlayer pattern. A second insulation interlayer may then be formed on the first channel layer. The second insulation interlayer, the first channel layer and the one or more second plugs on the one or more first plugs may be sequentially removed to expose a surface of the one or more first plugs. The one or more first plugs may then removed until a surface of the impurity regions is exposed to form one or more serial openings having a height from the surfaces of the impurity regions to a surface of the second insulation interlayer. The one or more serial openings may be filled with a metal wiring.

According to an example embodiment of the present invention, a first MOS transistor and a second MOS transistor may be formed on a substrate. The first MOS transistor may include a first gate pattern and first source/drain regions doped with first impurities. The second MOS transistor may include a second gate pattern and second source/drain regions doped with second impurities. A first insulation interlayer pattern may be formed on the semiconductor substrate having the first and second MOS transistors. The first insulation interlayer pattern may have a first opening exposing surfaces of the first source/drain regions and a second opening exposing surfaces of the second source/drain regions. The first source/drain regions and the second source/drain regions may act as a seed layer. A first SEG process may be carried out on the exposed surfaces of the first and second impurity regions to form one or more first plugs, which may include single crystalline silicon germanium and partially fill the one or more first openings. A second SEG process may be performed on the one or more first plugs to form one or more second plugs including single crystalline silicon that fill the remainder of the one or more first openings. A third SEG process may be carried out on the first insulation interlayer pattern to form a first channel layer on the first insulation interlayer pattern. A third MOS transistor and a fourth MOS transistor may be formed on the first channel layer. The third MOS transistor may include a third gate pattern and third source/drain regions doped with third impurities. The fourth MOS transistor may include a fourth gate pattern and fourth source/drain regions doped with fourth impurities. A second insulation interlayer may be formed on the channel layer having the third and fourth MOS transistors. The second insulation interlayer, the first channel layer and the one or more second plugs on the one or more first plugs may be sequentially removed to expose a surface of the one or more first plugs. The one or more first plugs may then be removed until surfaces of the first and second impurity regions are exposed to form one or more serial openings, which may have a height from the surfaces of the first impurity regions to a surface of the second insulation interlayer and a second serial opening having a height from the surfaces of the second impurity regions to the surface of the second insulation interlayer. The one or more serial openings may be filled with a metal wiring.

According to an example embodiment of the present invention, one or more first plugs including the single crystalline silicon germanium and one or more second plugs including the single crystalline silicon may be formed. The two processes for removing the first and second plugs may be carried out to form one or more serial openings. Particularly, the process for removing the one or more second plugs uses the first plug an etching stop layer. The process for removing the one or more first plugs uses an etching selectivity.

Therefore, according to example embodiments of the present invention, the one or more serial openings may accurately expose the surfaces of the impurity regions of a MOS transistor. Thus, a stacked semiconductor device having improved electrical reliability may be readily manufactured according to example embodiments of the present invention.

According to an example embodiment of the present invention, a method of manufacturing a stacked semiconductor device may include preparing a seed layer that includes impurity regions doped with impurities, forming a first insulation interlayer pattern on the seed layer, the first insulation interlayer pattern having at least one first opening that exposes a surface of the seed layer in the impurity regions, forming at least one first plug including single crystalline silicon germanium that partially fills the at least one first opening, forming at least one second plug including single crystalline silicon that fills a remainder of the at least one first opening, removing the at least one second plug over the at least one first plug to expose a surface of the at least one first plug, and/or removing the at least one first plug until the surface of the seed layer in the impurity regions is exposed to form at least one serial opening.

According to an example embodiment of the present invention, forming the at least one second plug may include dry etching the at least one second plug using the at least one first plug as an etching stop layer.

According to an example embodiment of the present invention, removing the at least one first plug includes wet etching the at least one first plug, the wet etching being controlled based on etching selectivity between the at least one first plug and the seed layer.

According to an example embodiment of the present invention, the wet etching is performed using an SC-1 solution including at least one of $NH_4OH$, $H_2O_2$ and $H_2O$.

BRIEF DESCRIPTION OF THE DRAWINGS

The above and other features and advantages of example embodiments of the present invention will become readily apparent from considering the following detailed description in conjunction with the accompanying drawings wherein.

DESCRIPTION OF EXAMPLE EMBODIMENTS OF THE PRESENT INVENTION

Figure 1:
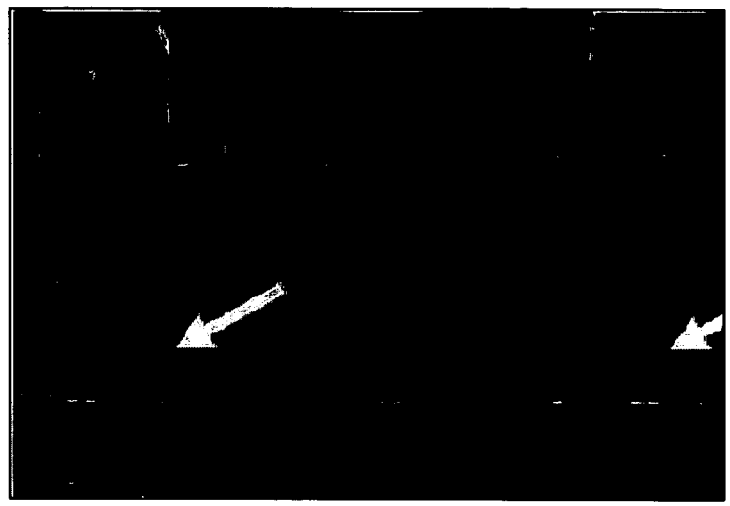
FIGS. 1 and 2 are pictures illustrating conventional stacked semiconductor devices.
Figure 2:
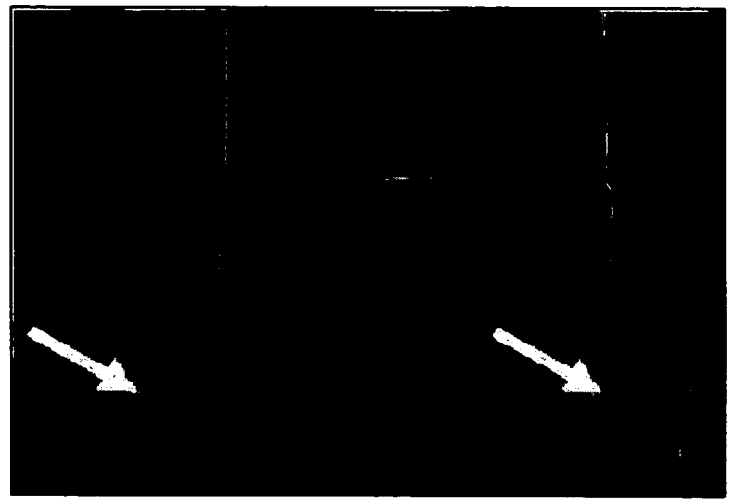

Example embodiments of the present invention are described more fully hereinafter with reference to the accompanying drawings, in which example embodiments of the invention are shown. This invention may, however, be embodied in many different forms and should not be construed as limited to the example embodiments of the present invention set forth herein. Rather, these example embodiments of the present invention are provided so that this disclosure will be thorough and complete, and will fully convey the scope of the invention to those skilled in the art. In the drawings, the size and relative sizes of layers and regions may be exaggerated for clarity.

It will be understood that when an element or layer is referred to as being. "on," "connected to" or "coupled to" another element or layer, it can be directly on, connected or coupled to the other element or layer or intervening elements or layers may be present. In contrast, when an element is referred to as being "directly on," "directly connected to" or "directly-coupled to" another element or layer, there are no intervening elements or layers present. Like numbers refer to like elements throughout the figures and specification. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, when the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "includes" and/or "including", when used in this specification, specify the presence of stated features, integers, steps, operations, elements, components, and/or groups thereof but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIGS. 3A to 3K are cross-sectional views illustrating a double stacked semiconductor device in accordance with an example embodiment of the present invention.

Figure 3A:
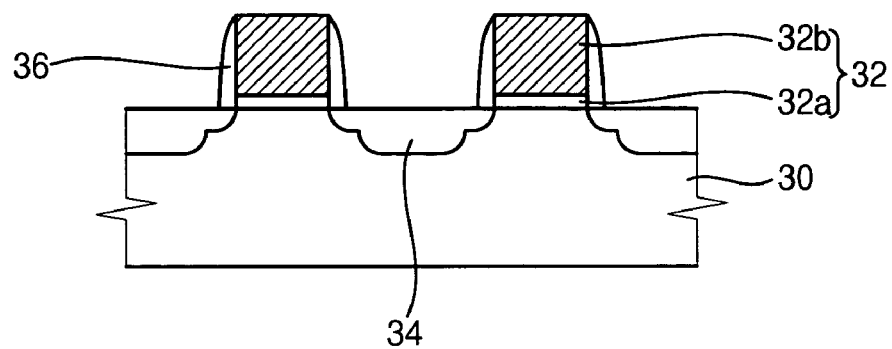
FIGS. 3A to 3K are cross-sectional views illustrating a double stacked semiconductor device in accordance with an example embodiment of the present invention.

Referring to FIG. 3A, a seed thin layer 30 may be prepared. Examples of the seed thin layer 30 include a silicon substrate, a silicon-on-insulator (SOI) substrate, a germanium-on-insulator (GOI) substrate, a silicon-germanium substrate, an epitaxial thin layer formed by a SEG process, etc. In an example embodiment of the present invention, because the seed thin layer 30 is positioned under a semiconductor structure, a semiconductor substrate, for example, a silicon substrate may be used as the seed thin layer 30. Thus, the semiconductor substrate may be the seed thin layer 30 in an example embodiment of the present invention as shown in FIG. 3A.

A trench isolation layer (not shown), which may be used as an isolation layer may be formed in the semiconductor substrate 30 and may define an active region and a field region of the semiconductor substrate 30. Because the trench isolation layer may have merits relating to integration degree as compared to a field isolation layer, the trench isolation layer may be used for the isolation layer according to an example embodiment of the present invention.

Particularly, a pad oxide layer (not shown) and a pad nitride layer (not shown) may be sequentially formed on the semiconductor substrate 30. The pad oxide layer and the pad nitride layer may be patterned to form a pad oxide layer pattern and a pad nitride layer pattern at least partially exposing a surface of the semiconductor substrate 30. The semiconductor substrate 30 may be etched using the pad oxide layer pattern and the pad nitride layer pattern as an etching mask to form a trench at a surface portion of the semiconductor substrate 30. The semiconductor substrate 30 may be thermally treated to cure damages of the semiconductor substrate 30 generated in forming the trench. An oxide layer (not shown) having a good gap-filling characteristic may be formed on the semiconductor substrate 30 to fill up the trench. According to an example embodiment of the present invention, the oxide layer may be formed by a plasma-enhanced chemical vapor deposition (PECVD) process. The oxide layer may be removed by a chemical mechanical polishing (CMP) process to expose a surface of the pad nitride layer pattern. The pad nitride layer pattern and the pad oxide layer pattern may then be removed by an etching process using a phosphorous acid solution, for example. As a result, the oxide layer may only exist in the trench, thereby completing the trench isolation layer.

A gate pattern 32 and source/drain, regions 34 may be formed in the active region of the semiconductor substrate 30. The gate pattern 32 may include a gate insulation layer pattern 32a and a gate conductive layer pattern 32b, which may serve as a gate electrode.

Particularly, a gate insulation layer (not shown) and a conductive layer (not shown) may be sequentially formed on the semiconductor substrate 30. Examples of the gate insulation layer include an oxide layer, a metal oxide layer, etc. Examples of the conductive layer include a polysilicon layer, a metal layer, a metal nitride layer, etc.

According to an example embodiment of the present invention, a metal oxide layer having a thin equivalent oxide thickness (EOT) and good leakage current characteristics may be used as the gate insulation layer. The metal oxide layer may be formed by an atomic layer deposition (ALD) process. The metal nitride layer may be used as the gate conductive layer. The metal nitride layer may be formed by a chemical vapor deposition (CVD) process.

The ALD process for forming the metal oxide layer as the gate insulation layer may include performing a cycle that may include providing a reaction material, purging, providing an oxidizing agent and purging. After completing the cycle, the metal oxide layer may be formed on the semiconductor substrate 30. The reaction material may include a metal precursor. Examples of the metal precursor include a hafnium precursor such as tetrakis ethyl methyl amino hafnium (TEMAH), $Hf[NC_2H_5CH_3]_4$), $Hf(O\text{-}tBu)_4$), etc., and an aluminum precursor such as trimethyl aluminum $[Al(CH_3)_3$, (TMA)], etc. Examples of the oxidizing agent include $O_3$, $O_2$, $H_2O$, plasma $O_2$, remote plasma $O_2$, etc.

When a titanium nitride layer is used as the metal nitride layer, the titanium nitride layer may be formed by a CVD process using a reaction gas such as a $TiCl_4$ gas, a $NH_3$ gas, etc., at a temperature of about 550° C.

After forming the gate insulation layer and the gate conductive layer on the semiconductor substrate 30, the gate insulation layer and the gate conductive layer may be patterned to form the gate pattern 32 including the gate insulation layer pattern 32a and the gate conductive layer pattern 32b. A photoresist pattern (not shown) partially exposing the gate conductive layer may be formed on the gate conductive layer. The gate conductive layer and the gate insulation layer may be etched using the photoresist pattern as an etching mask to form the gate pattern 32 including the gate insulation layer pattern 32a and the gate conductive layer pattern 32b. The photoresist pattern may then be removed by an ashing process and/or a stripping process.

In the example embodiment of the present invention shown in FIG. 3A, the gate conductive layer pattern 32b of the gate pattern 32 has a single layered structure that may include only the metal nitride layer, for example. Alternatively, the gate conductive layer pattern 32b may have a multi-layered structure that includes a polysilicon layer, a metal nitride layer, a metal silicide layer, etc.

After forming the gate pattern 32, impurities may be implanted into the semiconductor substrate 30 on one or both sides of the gate pattern 30 using the gate pattern 30 as an ion implantation mask to form shallow junction regions. Examples of the impurities include boron, phosphorous, arsenic, etc.

A spacer 36 may be formed on a sidewall of the gate pattern 32. An example of the spacer 36 may include a silicon nitride layer. The spacer 36 may be formed by an overall etching process using etching selectivity. Particularly, the silicon nitride layer may be formed on the semiconductor substrate 30 and/or the gate pattern 32. The etching process using the etching selectivity may be carried out on the silicon nitride layer until the surface of the semiconductor substrate 30 is exposed. As a result, the silicon nitride layer may only remain on the sidewalls of the gate pattern 32. The remaining silicon nitride layer may be the spacer 36, for example.

Alternatively, the process for forming the spacer 36 may be omitted. When the process for forming the spacer 36 is omitted, the shallow junction regions may be the source/drain regions 34.

According to an example embodiment of the present invention, impurities may be implanted into the semiconductor substrate 30 on one or both sides of the spacer 36 to form deep junction regions. The impurities in the deep junction regions may be substantially the same as those in the shallow junction regions. A concentration of the impurities in the deep junction regions may be higher than a concentration of the impurities in the shallow junction regions.

The shallow junction regions and the deep junction regions together may form the source/drain regions 34 having a lightly doped drain (LDD) structure in the semiconductor substrate 30, which may be adjacent to the gate pattern 32. As a result, a MOS transistor including the gate pattern 32 and the source/drain regions 34 doped with the impurities may be completed.

A double stacked semiconductor device according to an example embodiment of the present invention may be a stacked semiconductor substrate. When the double stacked semiconductor device is employed in an SRAM, the MOS transistor on the semiconductor substrate 30 may be an NMOS transistor including two pull-down elements and two access elements. Thus, the impurities in the source/drain regions 34 may include phosphorous, arsenic, etc.

Alternatively, when the stacked semiconductor device corresponds to a CMOS transistor, an NMOS transistor and a PMOS transistor may be formed on the semiconductor substrate 30. The NMOS transistor may be a first MOS transistor, which may include a first gate pattern and first source/drain regions doped with first impurities. The PMOS transistor may be a second MOS transistor, which may include a second gate pattern and second source/drain regions doped with second impurities. Examples of the first impurities include phosphorous, arsenic, etc. An example of the second impurities includes boron.

According to an example embodiment of the present invention, the semiconductor structure may correspond to a MOS transistor. Alternatively, the semiconductor structure may include various devices used in or with circuit designs. Hereinafter, the semiconductor structure on the semiconductor substrate 30 is referred to as a first semiconductor structure.

Figure 3B:
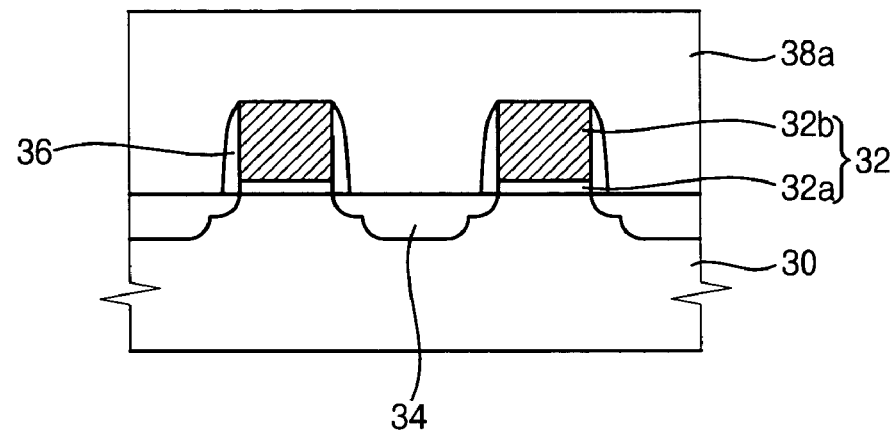

Referring to FIG. 3B, a first insulation interlayer 38a may be formed on the semiconductor substrate 30 and/or the first semiconductor structure including the MOS transistor, which may include the gate pattern 32 and the source/drain regions 34. An example of the first insulation interlayer 38a may include a silicon oxide layer. Examples of the silicon oxide layer may include a borophosphor silicate glass (BPSG) layer, a phosphor silicate glass (PSG) layer, an undoped silicate glass (USG) layer, a spin on glass (SOG) layer, etc. The BPSG layer and the PSG layer may be formed by a CVD process. The USG layer and the SOG layer may be formed by a coating process and/or an annealing process.

Figure 3C:
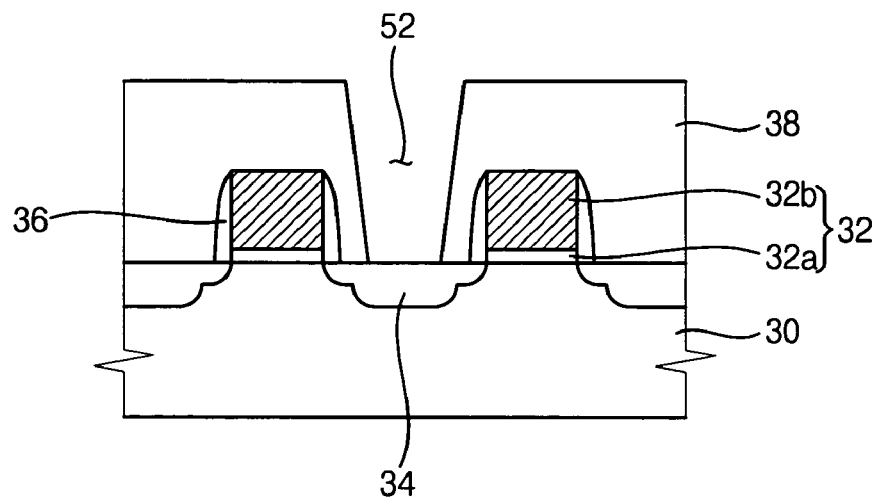

Referring to FIG. 3C, the first insulation interlayer 38a may be patterned to form a first insulation interlayer pattern 38 having an opening 52. The opening 52 at least partially exposes the source/drain regions 34 corresponding to an electrical contact portion.

According to an example embodiment of the present invention, the first insulation interlayer 38a may be formed by a photolithography process. That is, a photoresist pattern (not shown) partially exposing a portion of the first insulation interlayer 38a may be formed on the first insulation interlayer 38a The exposed portion of the first insulation interlayer 38a may be positioned over the source/drain regions 34. The first insulation interlayer 38a may be etched using the photoresist pattern as an etching mask to form the first insulation interlayer pattern 38 having the opening 52 that at least partially exposes the source/drain regions 34. The photoresist pattern may then be removed by an ashing process and/or a stripping process.

Figure 3D:
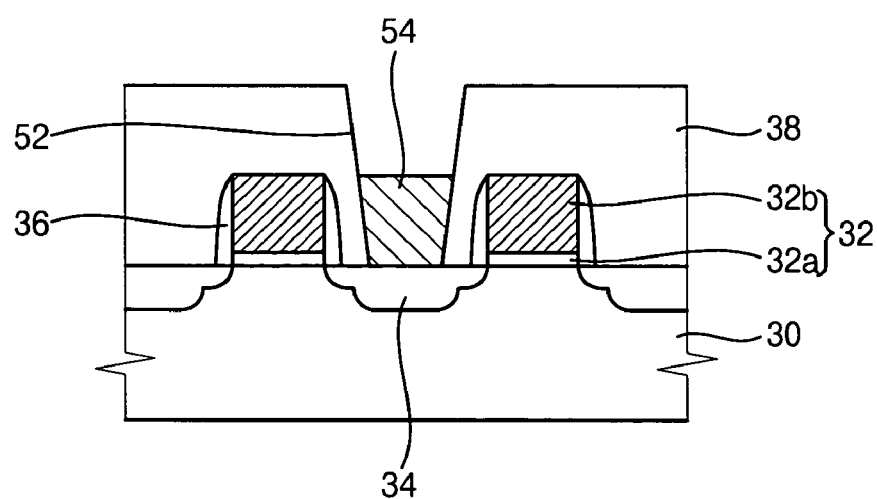

Referring to FIG. 3D, a first SEG process may be carried out on a portion of the semiconductor substrate 30 that is exposed through the opening 52 to form a first plug 54 including, for example, single crystalline silicon germanium that partially fills the opening 52.

According to an example embodiment of the present invention, a gas mixture of a silicon source gas and a germanium source gas may be introduced into a chamber having an appropriate temperature into which the semiconductor substrate 30 may be loaded to form the first plug 54. When the first SEG process for forming the first plug 54 is performed at a temperature below about 600° C., the first plug 54 may readily grow from the surface of the semiconductor substrate 30. When the first SEG process for forming the first plug 54 is performed at a temperature above about 1,100° C., thermal stresses may be applied to the first semiconductor structure on the semiconductor substrate 30. Thus, the first SEG process may be carried out at a temperature of about 600° C. to about 1,100° C. More specifically, the first SEG process may be carried out at a temperature of about 600° C. to about 900° C. Examples of the silicon source gas include a $SiH_4$ gas, a $Si_2H_6$ gas, etc. Examples of the germanium source gas include a $GeH_4$ gas, a $GeF_4$ gas, etc. The surface of the semiconductor substrate 30 may act as a seed in the first SEG process.

Further, when a thickness of the first plug 54 is below about 10% of a depth of the opening 52, the first plug 54 may not adequately function as an etching stop layer in a process described below for forming a serial opening. Still further, when a thickness of the first plug 54 is above about 90% of the depth of the opening 52, the first plug may not control the process described below for forming the serial opening. Thus, according to an example embodiment of the present invention, the thickness of the first plug 54 may be about 10% to about 90%, more specifically about 20% to about 80%, and even more specifically about 40% to about 60% of the depth of the opening 52.

To provide the first plug 54, which may act as the etching stop layer, a content ratio between silicon and the germanium in the first plug 54 may be about 0.5~0.9: about 0.1~0.5 according to an example embodiment of the present invention. More specifically, the content ratio between silicon and the germanium in the first plug 54 may be about 0.7~0.9: about 0.1~0.3.

Figure 3E:
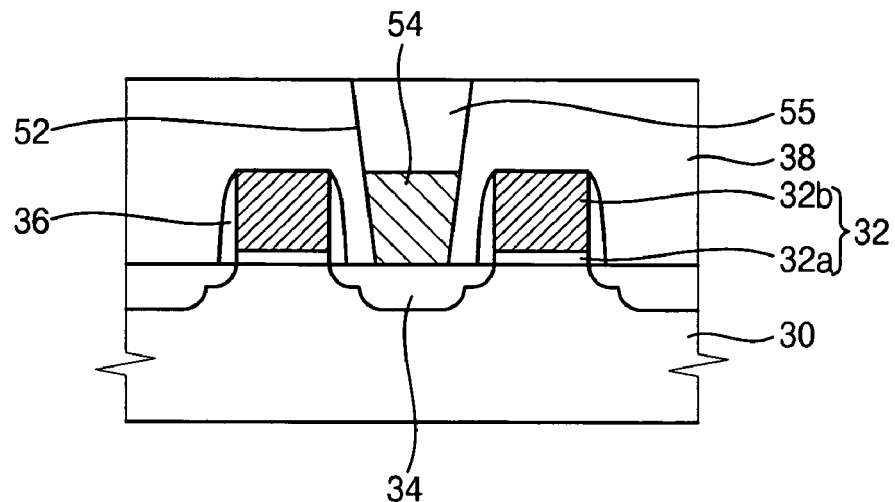

Referring to FIG. 3E, a second SEG process may be performed on the first plug 54 to form a second plug 55, which may include single crystalline silicon that fills the opening 52.

The second SEG process may be carried out in substantially the same manner as that for forming the first plug 54 except that the kinds of source gases used in the second SEG process may differ from the source gases used in the first SEG process. A silicon source gas, for example, a $SiH_4$ gas, a $Si_2H_6$ gas, etc., may be introduced into a chamber having a temperature of about 600° C. to about 1,100° C. to form the second plug 55 including the single crystalline silicon according to an example embodiment of the present invention. The first plug 54 may act as a seed in the second SEG process for forming the second plug 55. According to an example embodiment of the present invention, when the supply of the germanium source gas is suspended after forming the first plug and only the silicon source gas is introduced into the chamber, the second plug 55 may be formed in-situ.

However, in an example embodiment of the present invention, the SEG processes for forming the first plug 54 and the second plug 55 may also be carried out separately.

Further, during the second SEG process for forming the second plug 55, the second plug material may be formed on the first insulation interlayer pattern 38 around an upper end of the opening 52. The second plug material formed on the first insulation interlayer pattern 38 around the upper end of the opening 52 may be removed by a chemical mechanical polishing (CMP) process to form the second plug 55 as shown in FIG. 3E. Accordingly, the opening 52 may be completely filled with the first and second plugs 54 and 55.

Figure 3F:
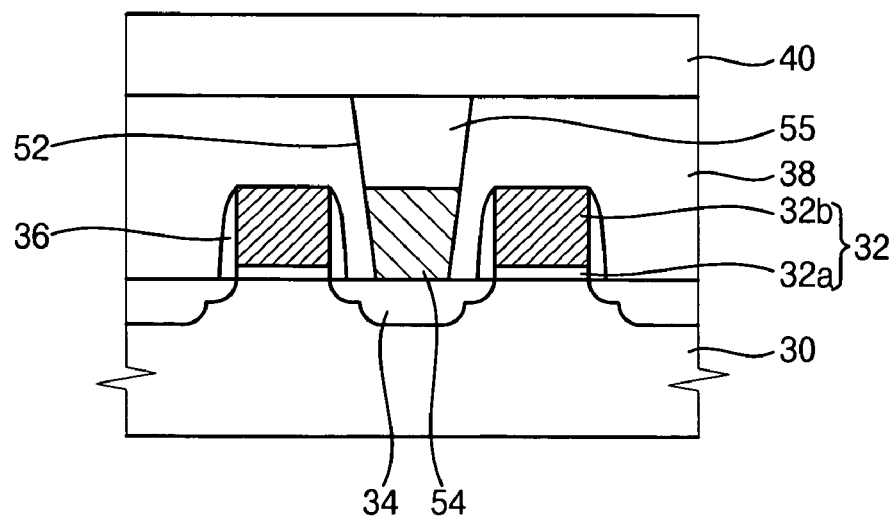

Referring to FIG. 3F, a third SEG process may be carried out on the first insulation interlayer pattern 38 to form a channel layer 40, which may include single crystalline silicon. According to an example embodiment of the present invention, the channel layer 40 may be used for forming a semiconductor structure, for example, a MOS transistor. Further, the channel layer 40 may have a structure substantially similar to the structure of the semiconductor substrate 30.

According to an example embodiment of the present invention, an amorphous silicon layer (not shown) may be formed on the second plug 55 and the first insulation interlayer pattern 38. The amorphous silicon layer may be thermally treated using a laser beam to convert the amorphous silicon layer into the channel layer 40 including the single crystalline silicon. The laser beam having energy sufficient to melt the amorphous silicon layer may be irradiated onto the amorphous silicon layer for a time of about several nanoseconds to about hundreds of nanoseconds. When the amorphous silicon layer is melted by the thermal treatment, the second plug 55 may serve as a seed to convert the amorphous silicon layer into the channel layer 40 including the single crystalline silicon.

Alternatively, the second SEG process may be substantially continuously performed to form the channel layer 40. As described above, when the second SEG process is continuously carried out, an epitaxial lateral overgrowth (ELO) may occur from a surface of the first insulation interlayer pattern 38 to form the channel layer 40 including the single crystalline silicon on the first insulation interlayer pattern 38. As a result, the channel layer 40 and the second plug 55 may be formed in-situ.

However, the processes for forming the channel layer 40 and the second plug 55 may also be carried out separately.

Further, because it may be difficult to form an isolation layer, for example, a trench isolation layer in the channel layer 40, the channel layer 40 may be patterned to guarantee an active region of the channel layer 40.

Figure 3G:
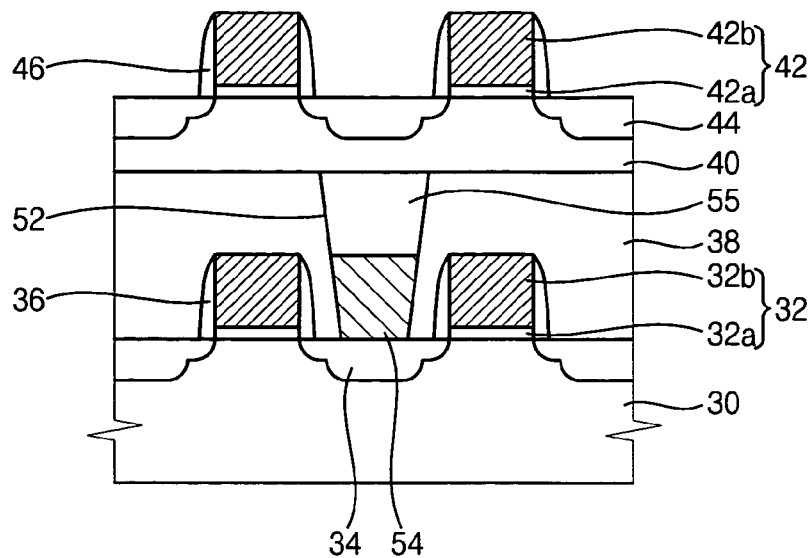

Referring to FIG. 3G, a semiconductor structure, for example, a MOS transistor, which may include a gate pattern 42 and source/drain regions 44, may be formed on the channel layer 40. Processes for forming the MOS transistor on the channel layer 40 may be substantially the same as those for forming the MOS transistor on the semiconductor substrate 30.

In brief, a gate insulation layer and a gate conductive layer may be formed on the channel layer 40 by performing processes substantially the same as those described with reference to FIG. 3A. The gate insulation layer and the gate conductive layer may be patterned to form a gate pattern 42, which may include a gate insulation layer pattern 42*a* and a gate conductive layer pattern 42*b*. Impurities may be implanted into the channel layer 40 adjacent to the gate pattern 42 to form shallow junction regions in the channel layer 40. A spacer 46 may be formed on a sidewall of the gate pattern 42. Impurities may be implanted into the channel layer 40 adjacent to the spacer 46 to form deep junction regions. As a result, the source/drain regions 44 having an LDD structure, which may include the shallow junction regions and the deep junction regions, may be completed.

Further, in an example embodiment, the semiconductor structure on the channel layer 40 may correspond to the MOS transistor. Alternatively, the semiconductor structure may include various devices used in and/or with circuit designs. Hereinafter, the semiconductor structure on the channel layer 40 is referred to as a second semiconductor structure.

According to an example embodiment of the present invention, the double stacked semiconductor device may be a stacked semiconductor substrate. When the double stacked semiconductor device is employed in an SRAM, the MOS transistor on the channel layer 40 may be a PMOS transistor including two pull-up elements. Thus, the impurities in the source/drain regions 44 may include boron, for example.

Alternatively, when the stacked semiconductor device corresponds to a CMOS transistor, an NMOS transistor and a PMOS transistor may be formed on the channel layer 40. The NMOS transistor may be a third MOS transistor, which may include a third gate pattern and third source/drain regions doped with first impurities. The PMOS transistor may be a fourth MOS transistor, which may include a fourth gate pattern and fourth source/drain regions doped with second impurities. Examples of the third impurities may include phosphorous, arsenic, etc. An example of the fourth impurities may include boron, for example.

Figure 3H:
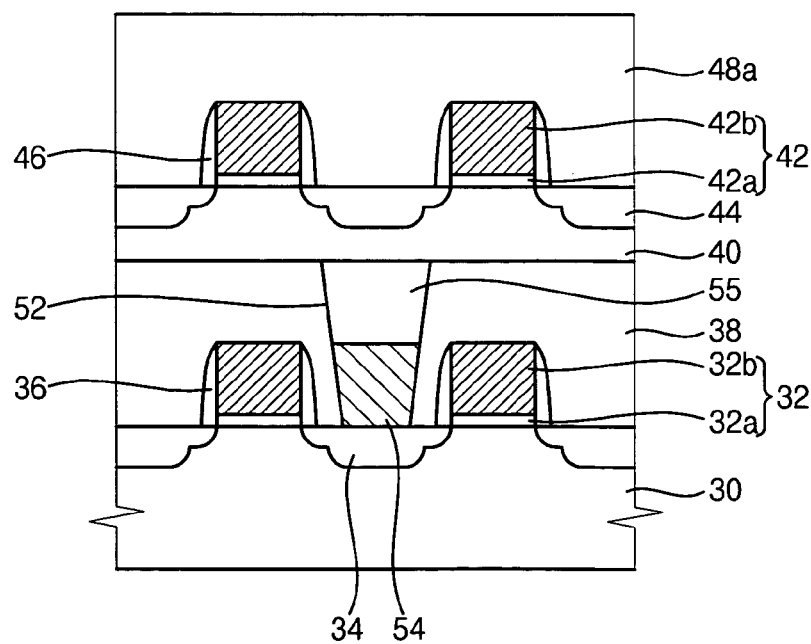

Referring to FIG. 3H, a second insulation interlayer 48*a* may be formed on the channel layer 40 and the second semiconductor structure. The second insulation interlayer 48*a* may include a material substantially the same as the material of the first insulation interlayer 38*a* Examples of the first insulation interlayer 38*a* may include a borophosphor silicate glass (BPSG) layer, a phosphor silicate glass (PSG) layer, an undoped silicate glass (USG) layer, a spin on glass (SOG) layer, etc.

Figure 3I:
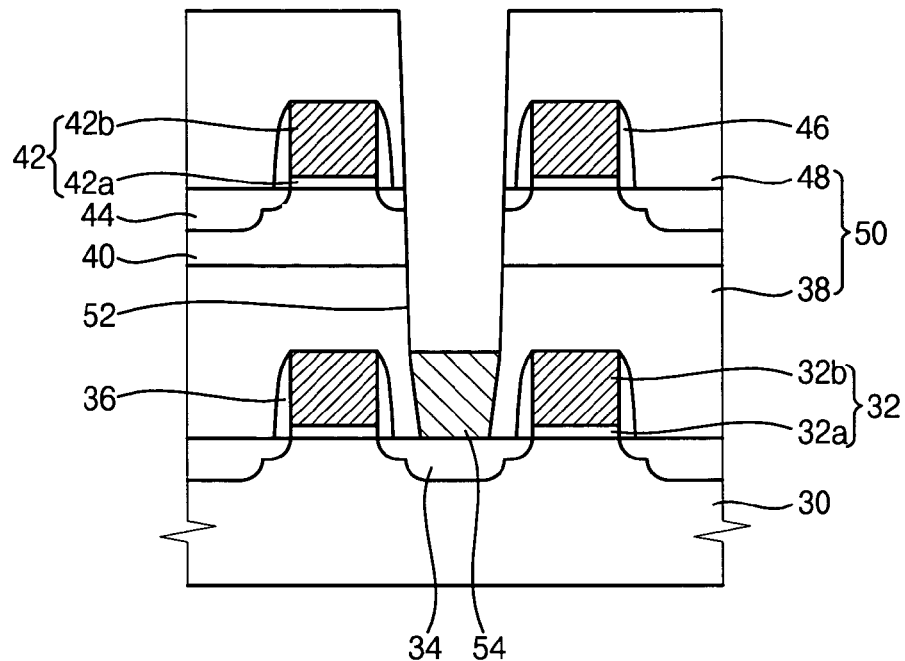

Referring to FIG. 3I, the second insulation interlayer 48*a*, the channel layer. 40 and the second plug 55 in the opening 52 of the first insulation-interlayer pattern 38 may be removed. Thus, the second insulation interlayer 48*a* may be converted into a second insulation interlayer pattern 48. Further, the first plug 54 may be exposed through the opening 52. According to an example embodiment of the present invention, the second insulation interlayer 48*a*, the channel layer 40 and the second plug 55 may be removed by an etching process. The etching process may include a dry etching process using the first plug 54 as an etching stop layer.

Figure 3J:
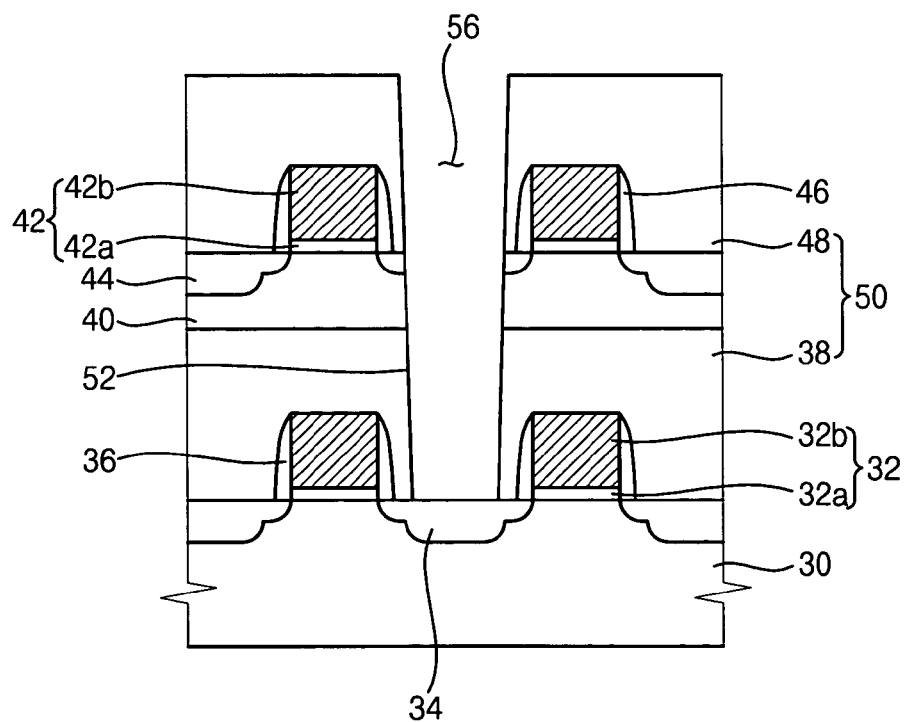

Referring to FIG. 3J, the exposed first plug 54 may then be removed. The first plug 54 may be removed by a wet etching process using, for example, an SC-1 solution, which may include $NH_4OH$, $H_2O_2$ and $H_2O$ and may have an etching selectivity between the first plug 54 and the first insulation interlayer pattern 38. According to an example embodiment of the present invention, because the first plug 54 may include the single crystalline silicon germanium, the wet etching process using the etching selectivity may be carried out on the first plug 54 so that the surface of the semiconductor substrate 30 may be accurately exposed.

After removing the first plug 54, a serial opening 56 may be formed from the surface of the semiconductor substrate 30. That is, the serial opening 56 may be formed through a multi-layered insulation layer pattern 50 including the first insulation interlayer pattern 38 and the second insulation interlayer pattern 48.

Figure 3K:
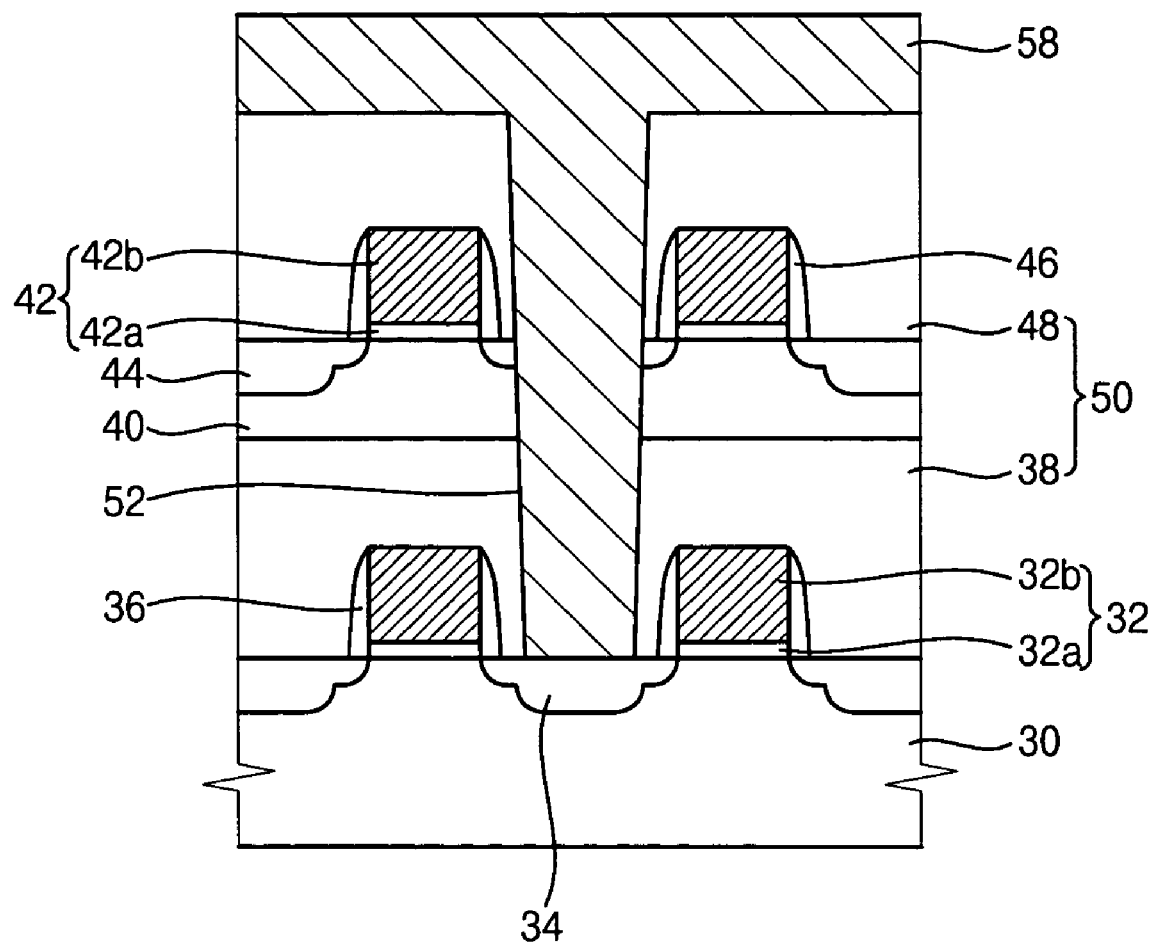

Referring to FIG. 3K, the serial opening 56 may be filled with a metal wiring 58. According to an example embodiment of the present invention, the metal wiring 58 may include a lining layer (not shown) formed on a side face and a bottom face of the serial opening 56 and a burying layer (not shown) formed on the lining layer to fill the serial opening 56.

The lining layer may be formed on the side face and the bottom face of the serial opening 56. The lining layer may have a multi-layered structure, which may include a titanium layer and a titanium nitride layer. The titanium layer having a thickness of about 30 Å to about 80 Å may be formed on the side face and the bottom face of the serial opening 56. The titanium nitride layer having a thickness of about 80 Å to about 150 Å may be formed on the titanium layer. The lining layer may be formed by a CVD process and/or a sputtering process.

The burying layer may be formed on the lining layer to fill the serial opening 56. The burying layer may include a tungsten layer having a good gap-filling characteristic. The burying layer may be formed by sequentially performing a stacking process and a planarizing process.

The metal wiring 58 may include the lining layer and the burying layer and may be electrically connected to the surface of the semiconductor substrate 30. For example, the metal wiring 58 may be connected to the source/drain regions 34.

According to an example embodiment of the present invention, because the first plug 54 includes the single crystalline germanium silicon, the serial opening 56 may be readily formed. Further, the metal wiring 58 may directly contact the surface of the semiconductor substrate 30 so that electrical resistances may be remarkably reduced as compared with conventional devices.

As a result, an example embodiment of the present invention may be employed in a manufactured stacked semiconductor device and may provide better electrical reliability than conventional devices.

FIGS. 4A to 4H are cross-sectional views illustrating a triple stacked semiconductor device according to an example embodiment of the present invention. Same reference numerals included in FIGS. 4A to 4H refer to substantially the same elements in FIGS. 3A to 3K.

Initially, it is noted that processes are carried out in the substantially the same manner as those described with reference to FIGS. 3A to 3H to form the second insulation layer 48a on the channel layer 40 having the second structure. According to an example embodiment of the present invention, the channel layer 40 may be referred to as a first channel layer.

Figure 4A:
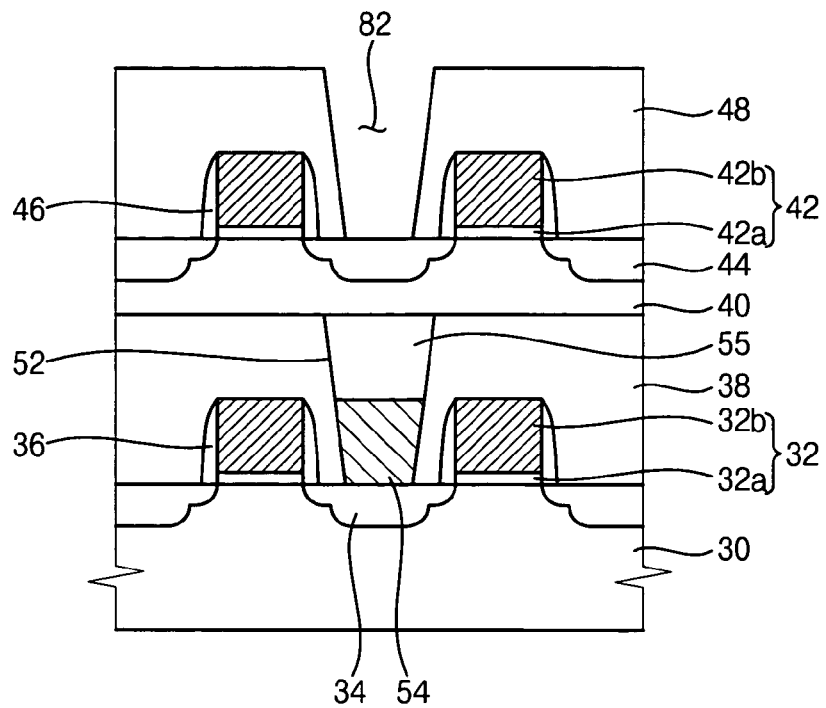
FIGS. 4A to 4H are cross-sectional views illustrating a triple stacked semiconductor device in accordance with an example embodiment of the present invention.

Referring to FIG. 4A, the second insulation interlayer 48a may be patterned to form a second insulation interlayer pattern 48 having an opening 82. The opening 82 at least partially exposes a surface of the first channel layer 40. The exposed surface of the first channel layer 40 may be positioned over the source/drain regions 34. The opening 82 is referred to as a second opening. Accordingly, the opening 52 in the first insulation layer pattern 38 is referred to a first-opening hereinafter.

The second insulation interlayer 48a may be formed by a photolithography process. That is, a photoresist pattern (not shown), which may partially expose the second insulation interlayer 48a, may be formed on the second insulation interlayer 48a. According to an example embodiment of the present invention, the exposed portion of the second insulation interlayer 48a may be positioned over the source/drain regions 34. The second insulation interlayer 48a may be etched using the photoresist pattern as an etching mask to form the second insulation interlayer pattern 48 having the second opening 82. The photoresist pattern may be removed by an ashing process and/or a stripping process.

Figure 4B:
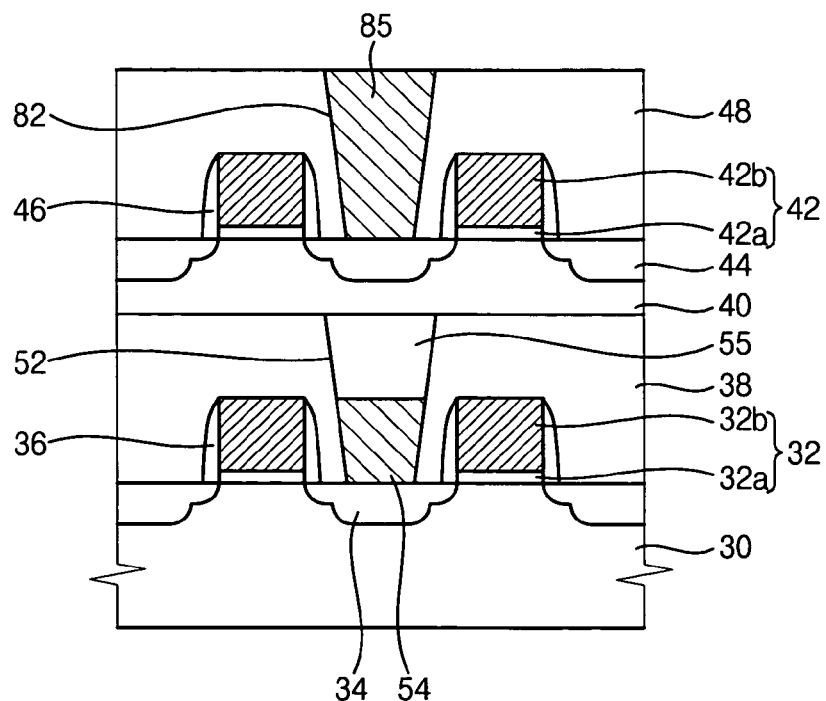

Referring to FIG. 4B, a SEG process may be carried out on the channel layer 40 exposed through the second opening 82 in the substantially the same manner as was explained with reference to FIG. 3E to form a third plug 85 including single crystalline silicon that fills the second opening 82.

Further, during a SEG process for forming the third plug 85, third plug material may be formed on the second insulation interlayer pattern 48 around an upper end of the second opening 82. The third plug material on the second insulation interlayer pattern 48 around the upper end of the second opening 82 may be removed by a chemical mechanical polishing (CMP) process, thereby creating the third plug 85. As a result, the second opening 82 may be filled with the third plug 85.

Figure 4C:
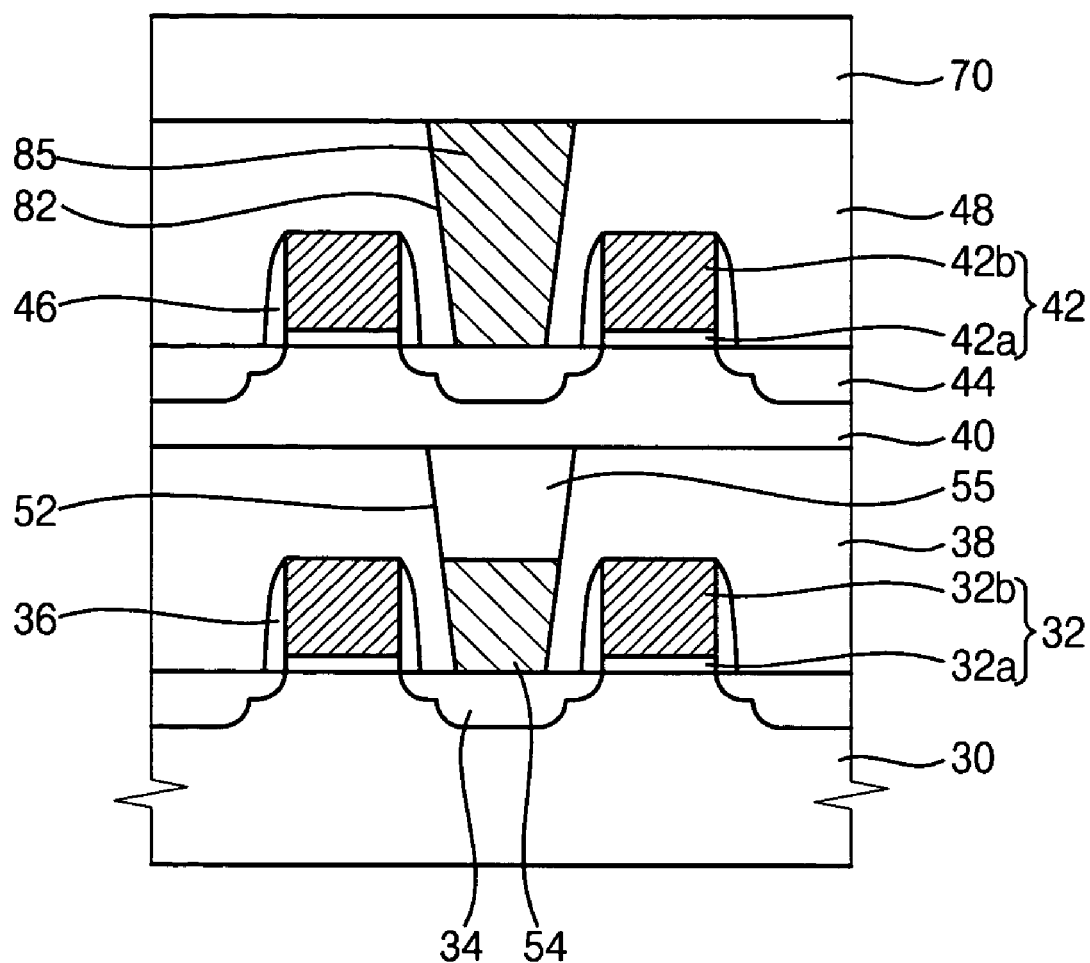

Referring to FIG. 4C, a SEG process may be carried out on the second insulation interlayer pattern 48 to form a second channel layer 70, which may include single crystalline silicon, in substantially the same manner as was described with reference to FIG. 3F. The second channel layer 70 may be used for forming the semiconductor structure, for example, a MOS transistor.

Alternatively, the SEG process may be continuously performed to form the second channel layer 70. As described above, when the SEG process is continuously carried out, an epitaxial lateral overgrowth (ELO) may occur from a surface of the second insulation interlayer pattern 48 to form the second channel layer 70, which may include the single crystalline silicon on the second insulation interlayer pattern 48. As a result, the second channel layer 70 and the third plug 85 may be formed in-situ.

However, the processes forming the second channel layer 70 and the third plug 85 may also be carried out separately.

Further, because it may be difficult to form an isolation layer, for example, a trench isolation layer in the second channel layer 70, the second channel layer 70 may be patterned to guarantee an active region of the second channel layer 70.

Figure 4D:
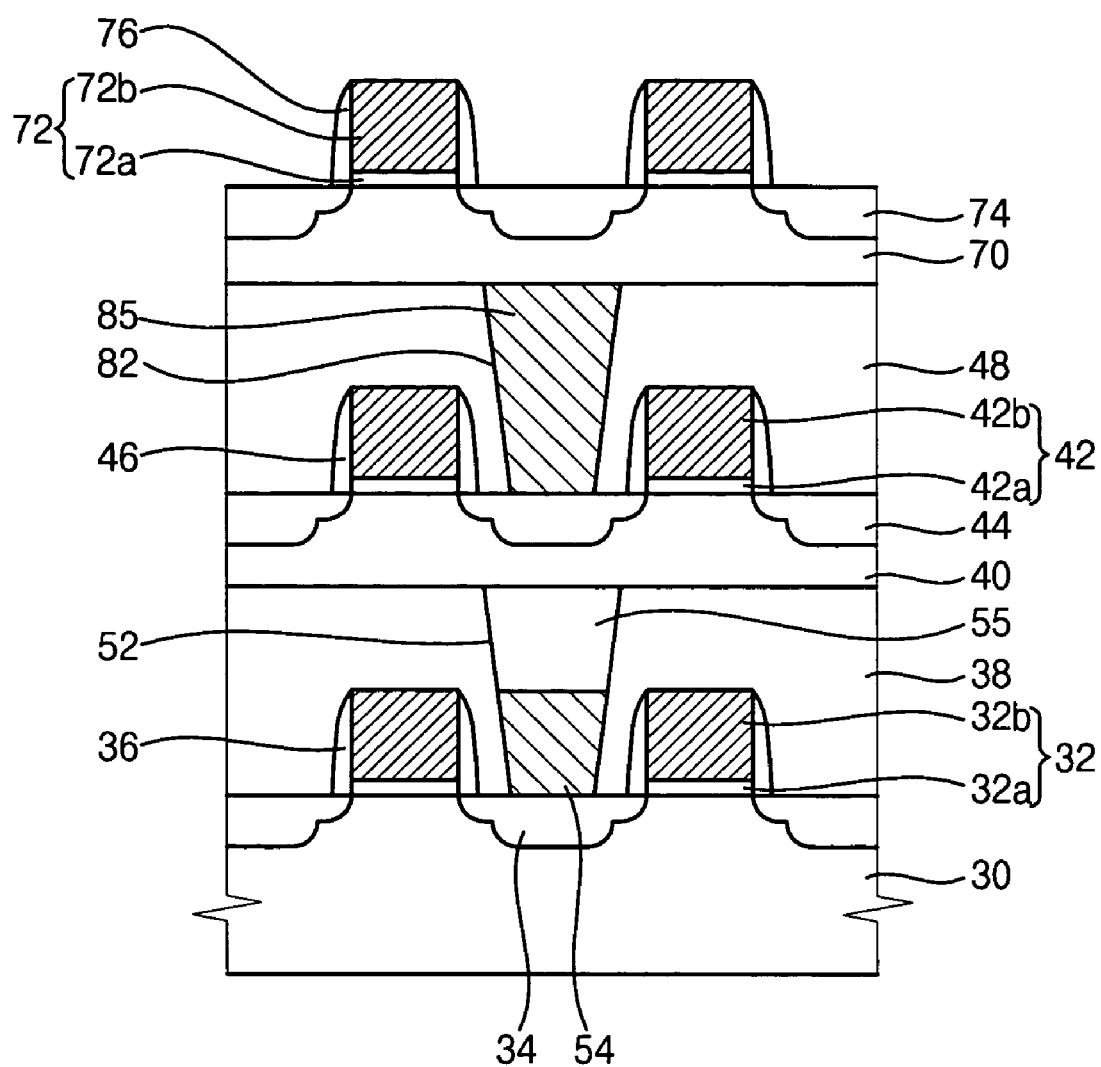

Referring to FIG. 4D, a semiconductor structure, for example, a MOS transistor that includes a gate pattern 72 and source/drain regions 74 may be formed on the second channel layer 70. Processes for forming the MOS transistor on the second channel layer 70 may be substantially the same as those for forming the MOS transistor of the first semiconductor structure and/or the MOS transistor of the second semiconductor structure.

In brief, a gate insulation layer and a gate conductive layer may be formed on the channel layer 70 by processes substantially the same as those described with reference to FIG. 3A. The gate insulation layer and the gate conductive layer may be patterned to form a gate pattern 72 including a gate insulation layer pattern 72a and a gate conductive layer pattern 72b. Impurities may be implanted into the second channel layer 70, which may be adjacent to the gate pattern 72, to form shallow junction regions in the second channel layer 70. A spacer 76 may be formed on a sidewall of the gate pattern 72. Impurities may be implanted into the second channel layer 70 adjacent to the spacer 76 to form deep junction regions. As a result, the source/drain regions 74, which may have an LDD structure including the shallow junction regions and the deep junction regions, may be completed.

According to an example embodiment of the present invention, the semiconductor structure on the second channel layer 70 may be a MOS transistor. Alternatively, the semiconductor structure may include various devices used in or with circuit designs. Hereinafter, the semiconductor structure on the second channel layer 70 is referred to as a second semiconductor structure.

According to an example embodiment of the present invention, the triple stacked semiconductor device may be a stacked semiconductor substrate. When the triple stacked semiconductor device is employed in an SRAM, the first semiconductor structure may be an NMOS transistor including two pull-down elements on the semiconductor substrate. The second semiconductor structure may be a PMOS transistor including two pull-up elements on the first channel layer 40. The third semiconductor structure may be an NMOS transistor including two access elements on the second channel layer 70.

Alternatively, when the stacked semiconductor is a CMOS transistor, an NMOS transistor and a PMOS transistor may be formed on the second channel layer 70. Thus, the NMOS transistor may be a fifth MOS transistor, which may include a fifth gate pattern and fifth source/drain regions doped with fifth impurities. The PMOS transistor may be a sixth MOS transistor, which may include a sixth gate pattern and sixth source/drain regions doped with sixth impurities. Examples of the fifth impurities may include phosphorous, arsenic, etc. An example of the sixth impurities may include boron.

Figure 4E:
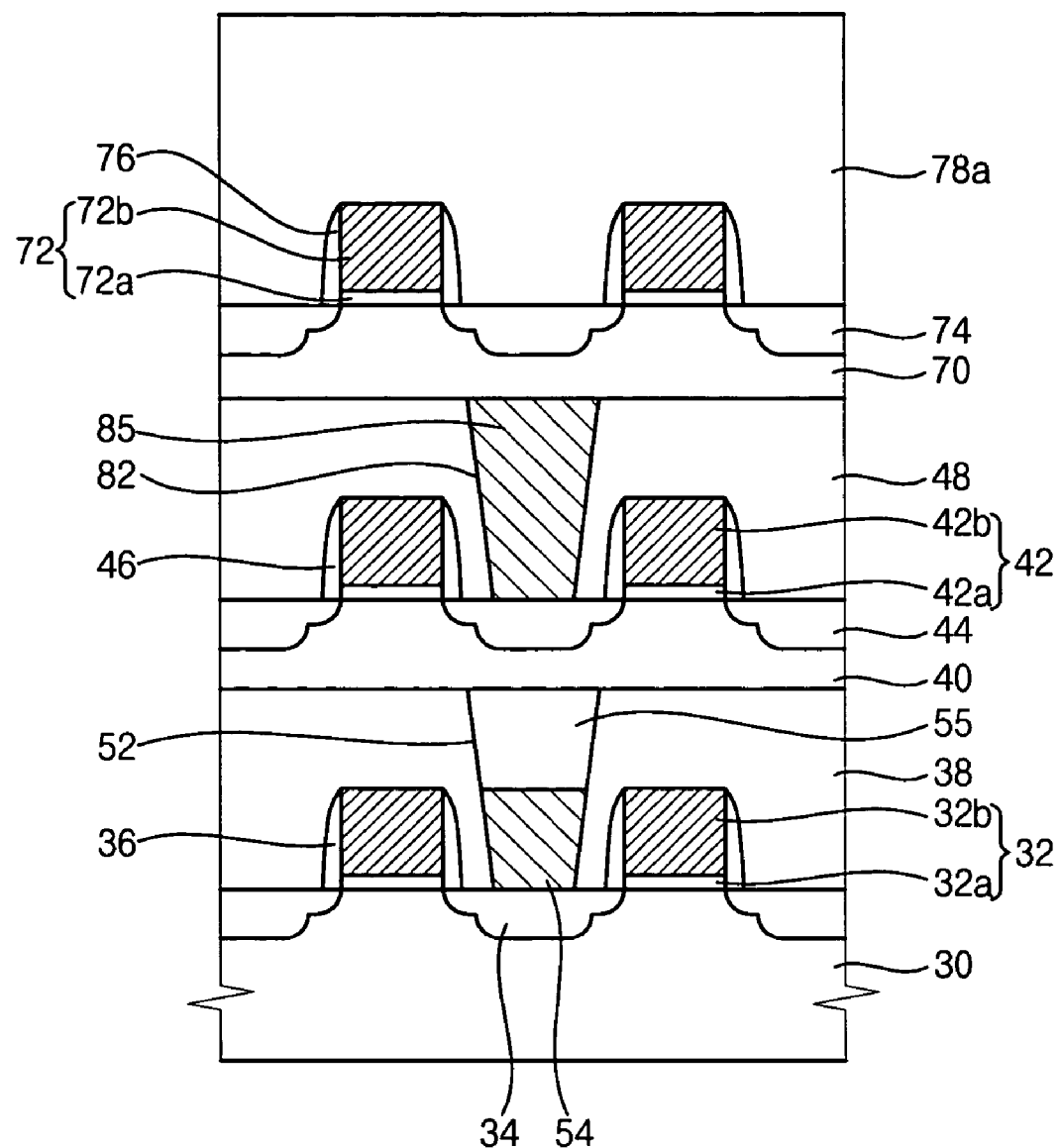

Referring to FIG. 4E, a third insulation interlayer 78a may be formed on the second channel layer 70 and the third semiconductor structure. The third insulation interlayer 78a may include a material substantially the same as the material of the first insulation interlayer 38a and/or the second insulation interlayer 48a. Thus, examples of the third insulation interlayer 78a may include a borophosphor silicate glass (BPSG) layer, a phosphor silicate glass (PSG) layer, an undoped silicate glass (USG) layer, a spin on glass (SOG) layer, etc.

Figure 4F:
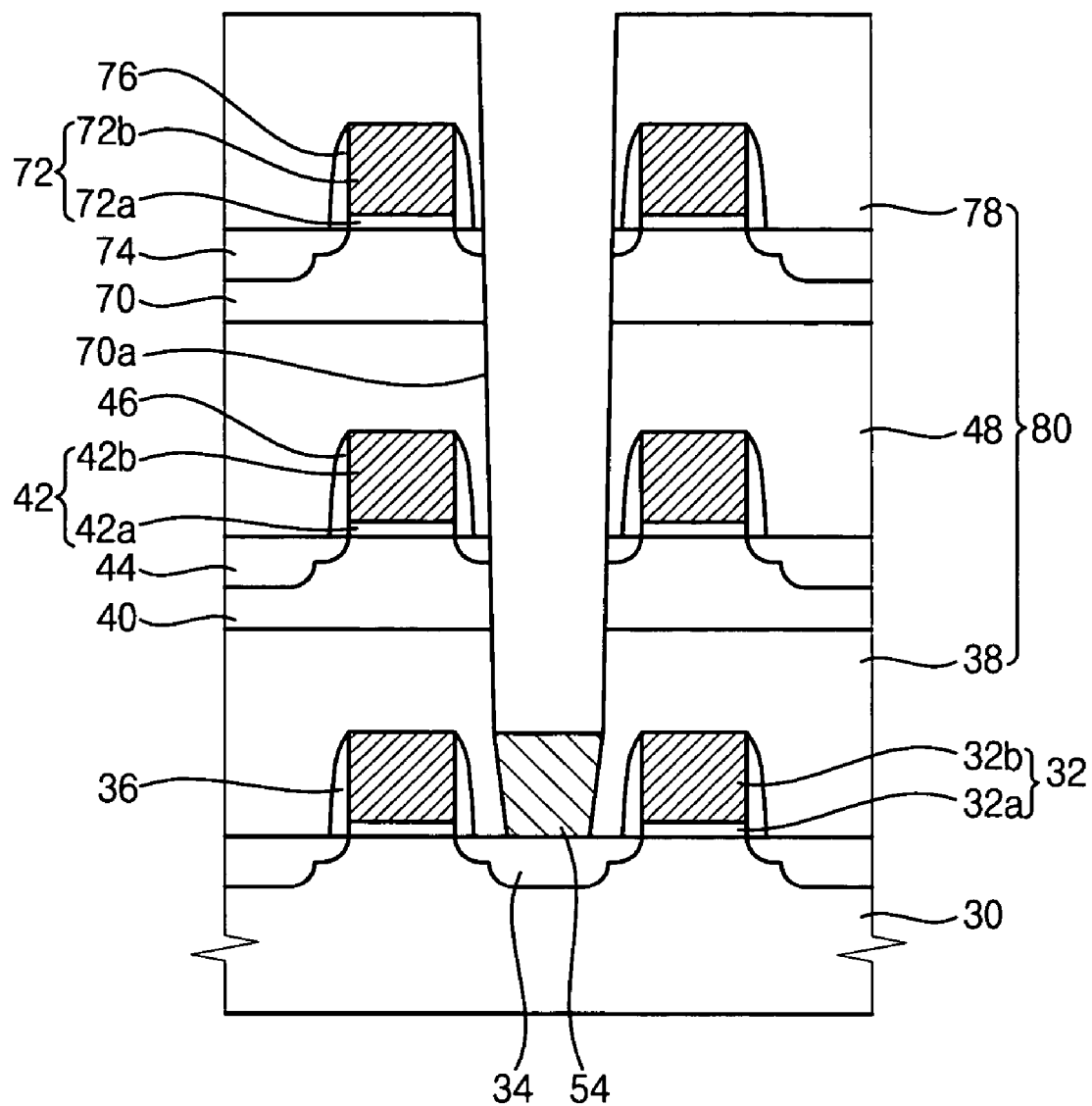

According to an example embodiment of the present invention as shown in FIG. 4F, the third insulation interlayer 78a, the second channel layer 70, the third plug 85 in the second opening 82, the first channel layer 40 and the second plug 55 in the first opening 52 may be removed. The third insulation interlayer 78a, the second channel layer 70, the third plug 85 in the second opening 82, the first channel layer 40 and the second plug 55 in the first opening 52 may be removed by an etching process, which may be substantially the same as the etching process described with reference to FIG. 3I. Thus, the third insulation interlayer 78a, the second channel layer 70, the third plug 85 in the second opening 82, the first channel layer 40 and the second plug 55 in the first opening 52 may be removed by a dry etching process using the first plug 54 as an etching stop layer.

Figure 4G:
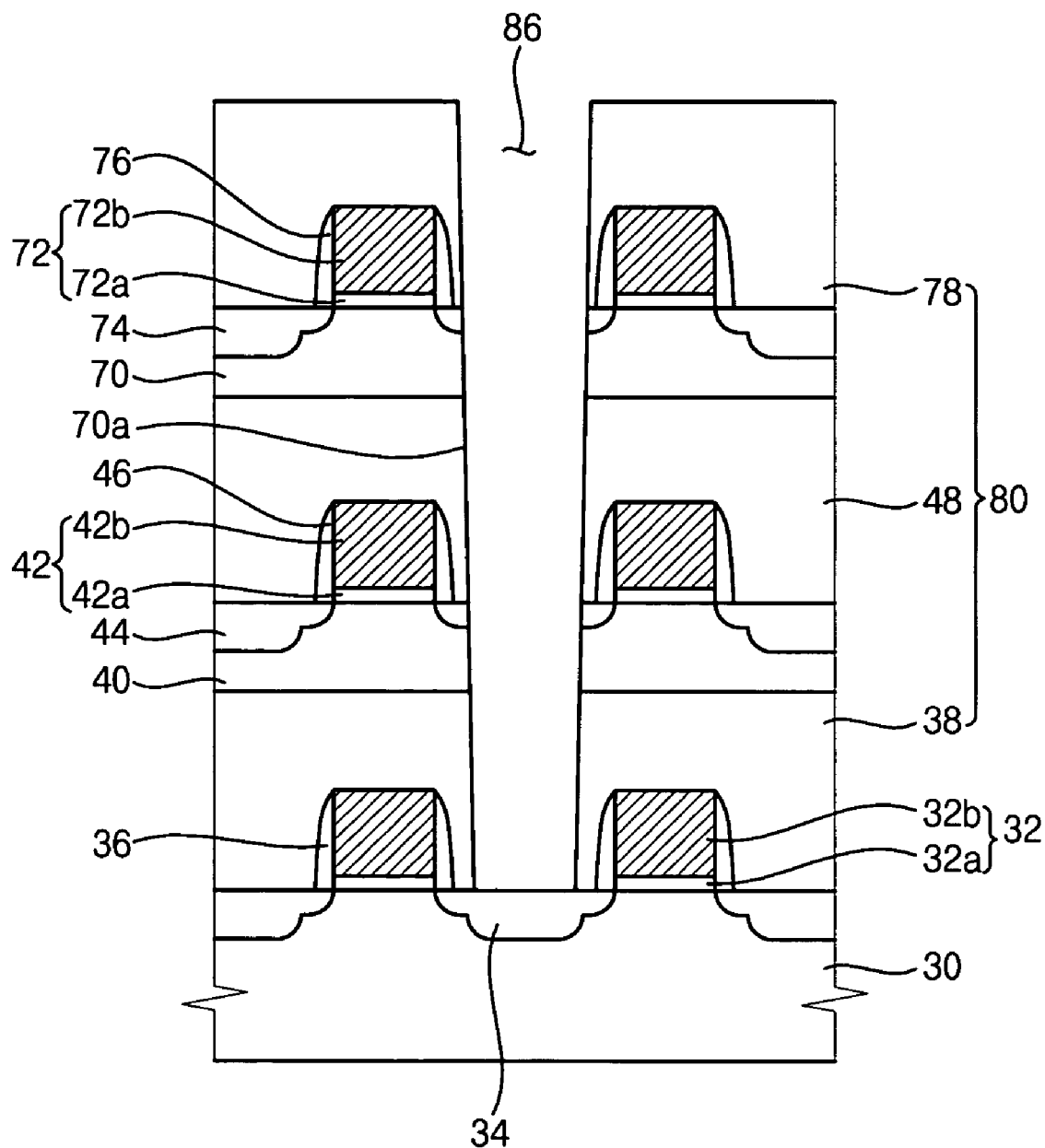

Referring to FIG. 4G, the exposed first plug 54 may be removed. The first plug 54 may be removed in substantially the same manner as was described with reference to FIG. 3J. Thus, the first plug 54 may be removed by a wet etching process using, for example, an SC-1 solution that may include $NH_4OH$, $H_2O_2$ and $H_2O$ and may have an etching selectivity between the first plug 54 and the first insulation interlayer pattern 38. According to an example embodiment of the present invention, because the first plug 54 includes the single crystalline silicon germanium, the wet etching process using the etching selectivity may be carried out on the first plug 54 so that the surface of the semiconductor substrate 30 may be accurately exposed.

After removing the first plug 54, a serial opening 86 may be formed on the surface of the semiconductor substrate 30. That is, the serial opening 86 may be formed through a multi-layered insulation layer pattern 80, which may include the first insulation interlayer pattern 38, the second insulation interlayer pattern 48 and the third insulation interlayer pattern 78.

Figure 4H:
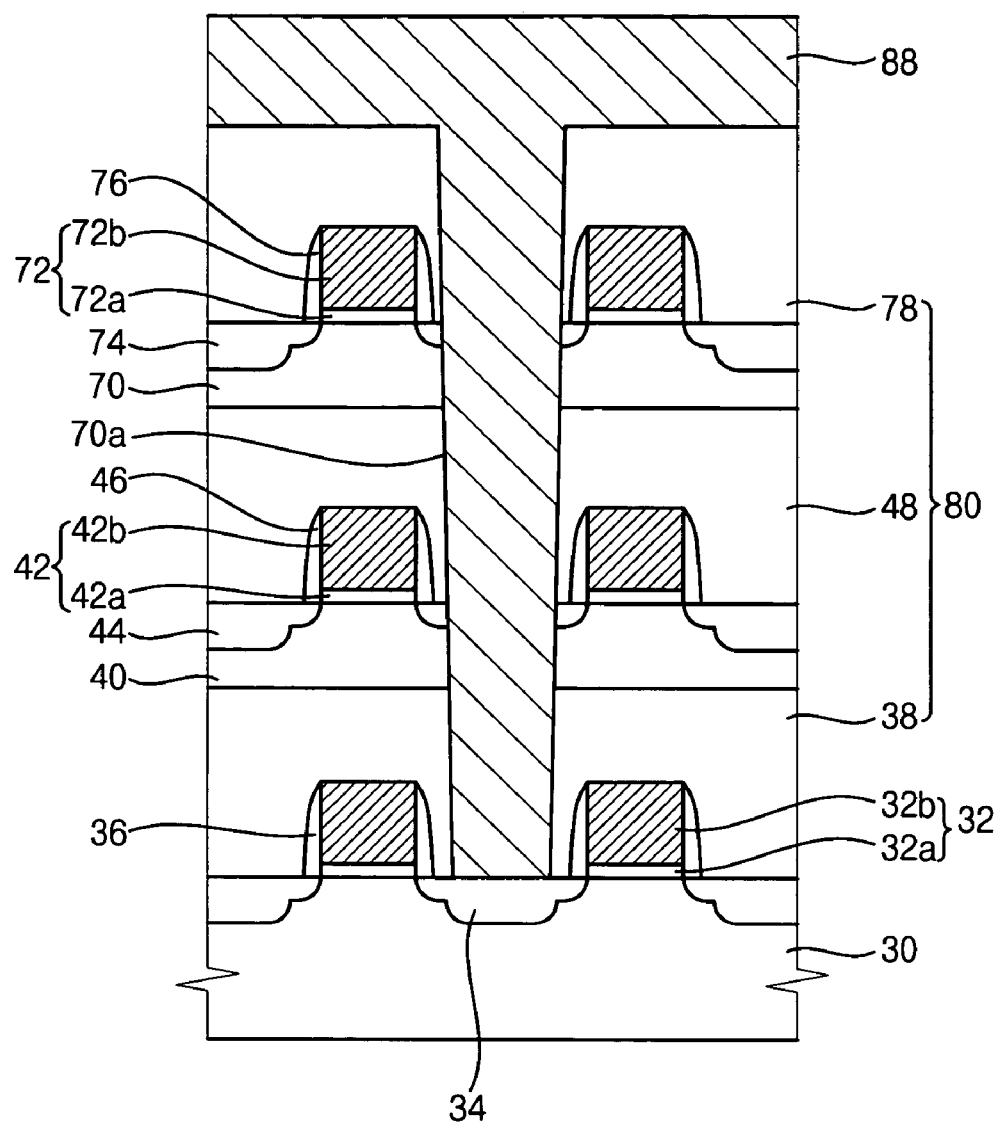

Referring to FIG. 4H, the serial opening 86 may be filled with a metal wiring 88. The metal wiring 88 may include a lining layer (not shown) formed on a side face and a bottom face of the serial opening 86 and a burying layer (not shown) formed on the lining later to fill the serial opening 86.

A process for forming the metal wiring 88 that includes the lining layer and the burying layer may be substantially the same as that for forming the metal wiring 58 in the double stacked semiconductor device, which was previously described. Thus, any further descriptions of the process for forming the metal wiring 88 are omitted herein for the sake of brevity.

The metal wiring 88 may include the lining layer and the burying layer and may be electrically connected to the surface of the semiconductor substrate 30. For example, the metal wiring 88 may be electrically connected to the source/drain regions 34.

According to an example embodiment of the present invention, because the first plug 54 includes the single crystalline germanium silicon, the serial opening 86 may be readily formed. Further, the metal wiring 88 may directly contact at least a portion of the surface of the semiconductor substrate 30 so that electrical resistances may be remarkably reduced as compared with conventional devices.

As a result, an example embodiment may be employed in a manufactured stacked semiconductor device and may provide better electrical reliability than conventional devices.

Further, in the above-mentioned example embodiments of the present invention, the present invention is employed in a double stacked semiconductor device and a triple stacked semiconductor device. It is noted that the present invention may also be employed in at least quadruple stacked semiconductor device.

That is, the method of the example embodiments of the present invention as described herein may further include forming $3^{rd}$ to $n^{th}$ insulation interlayer patterns, which may be substantially similar to the second insulation interlayer pattern on the second channel layer having the third semiconductor structure; forming $4^{th}$ to $p^{th}$ plugs substantially similar to the third plug; forming $4^{th}$ to $q^{th}$ channel layers substantially similar to the second channel layer; and forming $4^{th}$ to $r^{th}$ semiconductor structures substantially similar to the third semiconductor structure. Here, n represents a positive integer of no less than 4, p represents a positive integer of no less than 5, q represents a positive integer of no less than 4, and r represents a positive integer of no less than 5.

According to an example embodiment of the present inventions the serial opening exposing the surface of the semiconductor substrate may be readily formed. Thus, the surface of the semiconductor substrate and the metal wiring may be stably, electrically connected to each other according to an example embodiment of the present invention.

Therefore, stacked semiconductor devices, which may have an improved electrical reliability, may be formed using a method in accordance with an example embodiment of the present invention.

Having described example embodiments of the present invention, it is noted that changes, modifications and variations may be made by persons skilled in the art in light of the above teachings. It is therefore to be understood that these changes, modifications and variations are within the scope and the spirit of the present invention.

What is claimed is:

1. A method of manufacturing a stacked semiconductor device, comprising:
preparing a seed layer that includes impurity regions doped with impurities;
forming a first insulation interlayer pattern on the seed layer, the first insulation interlayer pattern having at least one first opening that exposes a surface of the seed layer in the impurity regions;
performing a first selective epitaxial growth (SEG) process on exposed surfaces of the seed layer to form at least one first plug including single crystalline silicon germanium that partially fills the at least one first opening;
performing a second SEG process on the at least one first plug to form a second plug including single crystalline silicon that fills a remainder of the at least one first opening;
performing a third SEG process on the first insulation interlayer pattern to form a first channel layer including single crystalline silicon on the first insulation interlayer pattern;
forming a second insulation interlayer on the first channel layer;
sequentially removing a portion of the second insulation interlayer, the first channel layer and the at least one second plug over the at least one first plug to form a thru-hole exposing an upper surface of the at least one first plug;
completely removing the at least one first plug until the surface of the seed layer in the impurity regions is exposed to form at least one serial opening; and filling the at least one serial opening with at least one metal wiring.

2. The method of claim 1, wherein the at least one serial opening has a height from the surface of the seed layer to a surface of the second insulation interlayer.

3. The method of claim 1, wherein the impurities include at least one of phosphorous, arsenic and boron.

4. The method of claim 1, wherein the seed layer includes at least one of a silicon substrate, a silicon-on-insulator (SOI) substrate, a germanium substrate, a germanium-on-insulation (GOI) substrate, a silicon-germanium substrate and an epitaxial layer formed by a SEG process.

5. The method of claim 1, wherein performing the second SEG process to form the at least one second plug and performing the third SEG process to form the first channel layer are carried out in-situ.

6. The method of claim 1, wherein the second insulation interlayer, the first channel layer and the at least one second plug are sequentially removed by a dry etching process using the at least one first plug as an etching stop layer.

7. The method of claim 1, wherein the at least one first plug is removed by a wet etching process using an SC-1 solution that includes $NH_4OH$, $H_2O_2$ and $H_2O$ and has an etching selectivity between the at least one first plug and the first insulation interlayer pattern.

8. The method of claim 1, further comprising:
forming a first semiconductor structure including a first MOS transistor on the seed layer; and
forming a second semiconductor structure including a second MOS transistor on the channel layer.

9. The method of claim 1, further comprising:
patterning the second insulation interlayer to form a second insulation interlayer pattern having at least one second opening that exposes a surface of the channel layer over the impurity regions of the seed layer;
performing a fourth SEG process on the surface of the first channel layer to form at least one third plug that fills the second opening;
performing a fifth SEG process, which is substantially the same as the third SEG process, on a surface of the second insulation interlayer pattern to form a second channel layer including single crystalline silicon on the second insulation interlayer pattern; and
forming a third semiconductor structure including a third MOS transistor on the second channel layer.

10. The method of claim 9, wherein performing the fourth SEG process to form the at least one third plug and performing a fifth SEG process to form the second channel layer are carried out in-situ.

11. The method of claim 9, further comprising:
forming $3^{rd}$ to $n^{th}$ insulation interlayer patterns substantially similar to the second insulation interlayer pattern on the second channel layer having the third semiconductor structure, wherein n represents a positive integer of no less than 4;
forming at least one $4^{th}$ to $p^{th}$ plugs substantially similar to the at least one third plug, wherein p represents a positive integer of no less than 5;
forming $4^{th}$ to $q^{th}$ channel layers substantially similar to the second channel layer, wherein q represents a positive integer of no less than 4; and
forming $4^{th}$ to $r^{th}$ semiconductor structures substantially similar to the third semiconductor structure, wherein r represents a positive integer of no less than 5.

12. The method of claim 1, further comprising:
forming a first MOS transistor and a second MOS transistor on a substrate, the first MOS transistor including a first gate pattern and first source/drain regions doped with first impurities, and the second MOS transistor including a second gate pattern and second source/drain regions doped with second impurities, the first source/drain regions and the second source/drain regions being the seed layer; and
forming a third MOS transistor and a fourth MOS transistor on the first channel layer, the third MOS transistor including a third gate pattern and third source/drain regions doped with third impurities, and the fourth MOS transistor including a fourth gate pattern and fourth source/drain regions doped with fourth impurities, wherein
the first insulation interlayer is formed on the first MOS transistor and the second MOS transistor and includes the at least one first opening, and the second insulation interlayer is formed on the first channel layer, the third MOS transistor and the fourth MOS transistor.

13. The method of claim 12, wherein the first, second, third and fourth impurities comprise phosphorous, arsenic or boron.

14. The method of claim 12, wherein performing the second SEG process to form the at least one second plug and performing the third SEG process to form the first channel layer are carried out in-situ.

15. The method of claim 12, wherein the second insulation interlayer, the first channel layer and the at least one second plug are sequentially removed by a dry etching process using the at least one first plug as an etching stop layer, and the at least one first plug is removed by a wet etching process using an SC-1 solution that includes $NH_4OH$, $H_2O_2$ and $H_2O$, and has an etching selectivity between the at least one first plug and the first insulation interlayer pattern.

16. The method of claim 12, further comprising:
patterning the second insulation interlayer to form a second insulation interlayer pattern having at least one second opening that exposes a surface of the first channel layer over the first source/drain regions and the second source/drain regions;
performing a fourth SEG process on the surface of the first channel layer to form at least one third plug that fills the at least one third opening;
performing a fifth SEG process on a surface of the second insulation interlayer pattern to form a second channel layer including single crystalline silicon on the second insulation interlayer pattern;
forming a fifth MOS transistor and a sixth MOS transistor on the second channel layer, the fifth MOS transistor including a fifth gate pattern and fifth source/dram regions doped with fifth impurities, and the sixth MOS transistor including a sixth gate pattern and sixth source/drain regions doped with sixth impurities; and
forming a third insulation interlayer on the second channel layer, the fifth MOS transistor and the sixth MOS transistor.

17. The method of claim 16, wherein performing the fourth SEG process to form the at least one third plug and performing the fifth SEG process to form the second channel layer are carried out in-situ.

18. The method of claim 16, wherein the fifth and sixth impurities include at least one of phosphorous, arsenic and boron.

19. A method of manufacturing a stacked semiconductor device, comprising:
preparing a seed layer that includes impurity regions doped with impurities;
forming a first insulation interlayer pattern on the seed layer, the first insulation interlayer pattern having at least one first opening that exposes a surface of the seed layer in the impurity regions;
forming at least one first plug including single crystalline silicon germanium that partially fills the at least one first opening;
forming at least one second plug including single crystalline silicon that fills a remainder of the at least one first opening;
removing a portion of the at least one second plug over the at least one first plug to form a thru-hole exposing an upper surface of the at least one first plug; and
completely the at least one first plug until the surface of the seed layer in the impurity regions is exposed to form at least one serial opening.

20. The method of claim 19, wherein forming the at least one second plug includes dry etching the at least one second plug using the at least one first plug as an etching stop layer.

21. The method of claim 20, wherein removing the at least one first plug includes wet etching the at least one first plug, the wet etching being controlled based on etching selectivity between the at least one first plug and the seed layer.

22. The method of claim 21, wherein the wet etching is performed using an SC-1 solution including at least one of $NH_4OH$, $H_2O_2$ and $H_2O$.

* * * * *